United States Patent [19]

Boland et al.

[11] Patent Number: 5,254,491

[45] Date of Patent: Oct. 19, 1993

[54] METHOD OF MAKING A SEMICONDUCTOR DEVICE HAVING IMPROVED FREQUENCY RESPONSE

[75] Inventors: Bernard W. Boland, Scottsdale; Robert B. Davies, Tempe; Paul W. Sanders, Scottsdale, all of Ariz.

[73] Assignee: Motorola, Inc., Schaumburg, Ill.

[21] Appl. No.: 763,773

[22] Filed: Sep. 23, 1991

[51] Int. Cl.$^5$ .......................................... H01L 21/76
[52] U.S. Cl. ........................................ 437/47; 437/67; 437/68; 437/33; 437/919
[58] Field of Search ................ 437/33, 47, 60, 67, 437/68, 919; 148/DIG. 50, DIG. 85, DIG. 86, DIG. 14

[56] References Cited

FOREIGN PATENT DOCUMENTS 61-154144 7/1986 Japan .

OTHER PUBLICATIONS

Wolf, S., et al, *Silicon Processing For The VLSI Era;* vol. 2, 1990, pp. 51-58 & 522-523.

*Primary Examiner*—George Fourson
*Attorney, Agent, or Firm*—Joe E. Barbee

[57] ABSTRACT

A technique for improving the frequency response of a semiconductor device employing silicon as the semiconductor material. Parasitic components inherent in semiconductor devices degrade the performance of these devices at higher frequencies. Typically, a parasitic capacitor includes a dielectric material sandwiched between a conductive interconnect (31A, 31B) and a substrate (10) or a bottom contact (18). Further, in the past, the thickness of this dielectric material has been similar to that of the third dielectric material (17) of the present invention. However, in the present invention the effective thickness of the dielectric material has been increased by including a first and second dielectric material (15, 16) as well as the third dielectric material (17). Increasing the thickness of the dielectric of a parasitic capacitor decreases the value of the parasitic capacitance; and therefore increases the cut-off frequency of the semiconductor device.

9 Claims, 2 Drawing Sheets 5,254,491

METHOD OF MAKING A SEMICONDUCTOR DEVICE HAVING IMPROVED FREQUENCY RESPONSE

BACKGROUND OF THE INVENTION

This invention relates, in general, to high frequency semiconductor devices, and more particularly to a method for making a semiconductor device having an improved frequency response.

With the advent of the communications age, the number of electronic communications products available for consumers in the private sector has proliferated immensely. For example, the mobile phone market accounts for a significant portion of the sales and profits realized by many segments of the electronics industry today. Unfortunately, the increase in communications products has meant a reduction in the number of available radio frequencies to carry communications signals. Hence, manufacturers of electronic communications equipment have sought ways to solve this dilemma.

The approach several communications equipment manufacturers have taken is to design their products to operate at higher frequencies. Thus, the manufacturers of semiconductor components used in communications equipment must follow suit and design semiconductor devices to accommodate these higher frequencies. In the present state of the art, integrated circuit manufacturers have two semiconducting materials available that are capable of operating at higher frequencies: gallium arsenide and silicon. Although, gallium arsenide can readily handle higher frequencies, the cost is prohibitive for most applications. Silicon, on the other hand is relatively inexpensive, however several parasitic components inherent in silicon semiconductor devices surface under high frequency operation; the most insidious of which are the multitude of parasitic capacitances which arise. Accordingly, it would be beneficial to have a method for increasing the high frequency performance of semiconductor devices fabricated in silicon in order to take advantage of the lower cost associated with silicon.

SUMMARY OF THE INVENTION

Briefly stated, the present invention has a method for making a semiconductor device having an improved frequency response. The method includes increasing the thickness of a dielectric material between at least one top surface conductive interconnect and the silicon substrate. The thicker dielectric material comprises a trough, lined by a first dielectric material, and filled with a second dielectric material. Further, conductive interconnects are separated from the dielectric filled troughs by a third dielectric material, which can be the same as the first dielectric material.

DETAILED DESCRIPTION OF THE DRAWINGS

Semiconductor devices are limited in their high frequency performance by a multitude of parasitic elements, including capacitances, that arise when operated at higher frequencies. Manufacturers of semiconductor devices strive to reduce, and optimally eliminate, these parasitic elements; thereby improving the frequency performance of their devices.

Figure 1:
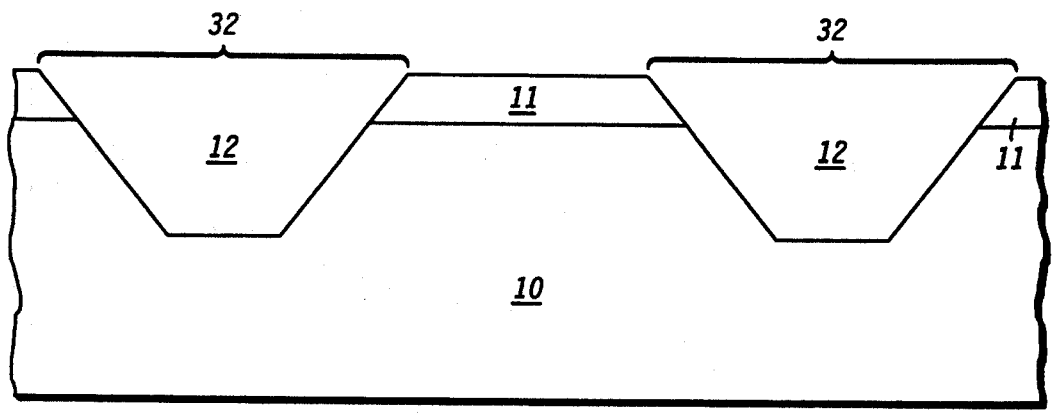
FIGS. 1-3 illustrate highly enlarged cross-sectional views of a portion of a semiconductor device during fabrication in accordance with the present invention.
Figure 2:
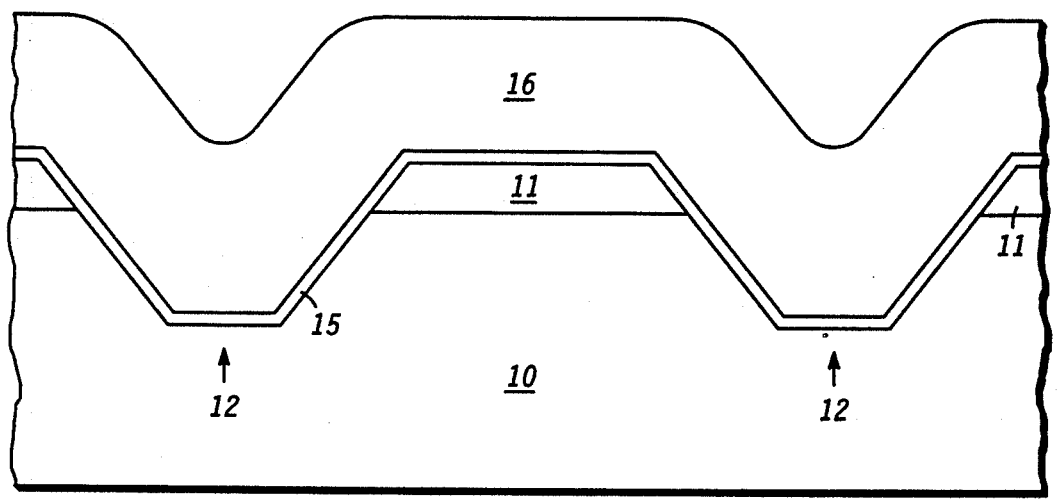
Figure 3:
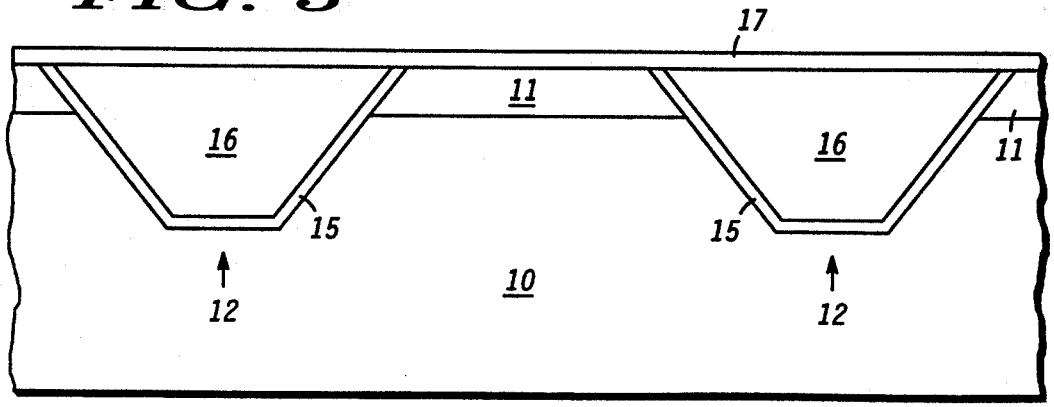

FIGS. 1-5 are shown to illustrate features of the present invention, hence the FIGURES are not drawn to scale. FIGS. 1-3 illustrate highly enlarged cross-sectional views of portions of a semiconductor device during the fabrication sequence in accordance with the present invention. The embodiment of FIG. 1 shows a semiconductor substrate 10 of single crystal silicon with a <100> crystal orientation, and having a P++ conductivity type. Also in this embodiment, an epitaxial layer 11 is grown over substrate 10, wherein epitaxial layer 11 has a P− conductivity type. Preferably, layer 11 has a thickness of approximately 15 micrometers. In a second embodiment, substrate 10 is single crystal silicon with a <100> crystal orientation having an N− conductivity type; with epitaxial layer 11 having an N-conductivity type.

Using generally accepted fabrication techniques at least one trough 12 is formed in substrate 10, wherein the at least one trough 12 extends from a top surface of epitaxial layer 11 into substrate 10. Two troughs 12 are illustrated in FIG. 1, although there may be only one trough 12 or a plurality of troughs 12. Moreover, trough 12 may be circular in configuration thereby surrounding a given portion of epitaxial layer 11, wherein trough 12 serves as a moat 12.

Troughs 12 typically extend approximately 5 micrometers into substrate 10 and are formed by etching a portion of epitaxial layer 11 and a portion of substrate 10 with an etchant that preferentially etches along the <100> crystal plane; thereby forming an angle of approximately 54 degrees with respect to the top surface of epitaxial layer 11. A suitable means for accomplishing this anisotropic etch is to employ a wet etch comprising potassium hydroxide, normal propanol, and deionized water. Hence, the maximum depth possible for troughs 12 occurs when troughs 12 are V-shaped.

Moreover, since the angle of the etch is constant, the depth of the etch is a function of the width of troughs 12 at the top surface of epitaxial layer 11. Thus, for troughs 12 having a depth of approximately 20 micrometers, the width of troughs 12 at the top surface of epitaxial layer 11 are approximately 4 millimeters. It will be understood that the types of substrate 10 and epitaxial layer 11 materials, conductivity types, and dimensions, as well as the dimensions for troughs 12 are not limitations to the present invention.

Now referring to FIG. 2, a first dielectric material 15 is formed over the top surface of epitaxial layer 11 and in troughs 12. First dielectric material 15 serves as an insulating layer 15 that masks the top surface of epitaxial layer 11 and troughs 12. In a preferred embodiment, first dielectric material 15 is silicon dioxide having a thickness of approximately 1 micrometer. Further, first dielectric material 15 is grown at temperatures sufficiently low to avoid diffusion of an impurity material from substrate 10 into epitaxial layer 11; a phenomenon commonly referred to as autodoping. Autodoping effectively decreases the thickness of epitaxial layer 11.

A second dielectric material 16 is formed over first dielectric material 15, wherein second dielectric material 16 fills troughs 12 and extends above the top surface of epitaxial layer 11. A preferred material for second dielectric material 16 is intrinsic polysilicon having a resistivity greater than 100 ohm-centimeter. Typically, the intrinsic polysilicon is deposited epitaxially.

Although second dielectric material 16 may comprise any of a number of materials, there are at least three advantages in selecting polysilicon. The first advantage is that the random structure of the polysilicon crystal prevents formation of resonance structures that can act as a notch filter. Second, cusping does not occur when depositing polysilicon into troughs 12, as is possible with other types of dielectric materials, thereby preventing the creation of voids in second dielectric material 16. Finally, polysilicon affords the opportunity to fabricate other electrical components in troughs 12.

As shown in FIG. 3, a top surface of second dielectric material 16 is planarized by employing planarization techniques that are well know to those skilled in the art. Further, the step of planarization includes removing a portion of both epitaxial layer 11 and first dielectric material 15. Hence, the top surface of second dielectric material 16, the top surface of epitaxial layer 11, and an exposed portion of first dielectric material 15 form a continuous coplanar surface. The step of planarizing further includes a polishing step wherein the coplanar surface is polished. In yet a further embodiment, approximately 1 micrometer of epitaxial layer 11 is removed during the planarization step.

A third dielectric material 17 is formed over the continuous coplanar surface. In a preferred embodiment, third dielectric material is silicon dioxide having a thickness of 1 micrometer. Third dielectric material 17 serves as a field oxide for subsequent processing steps in which semiconductor devices are fabricated in an active area adjacent to troughs 12. Further, it will be understood that the materials for first and third dielectric materials, 15 and 17 respectively, may be the same or they may be different.

Figure 4:
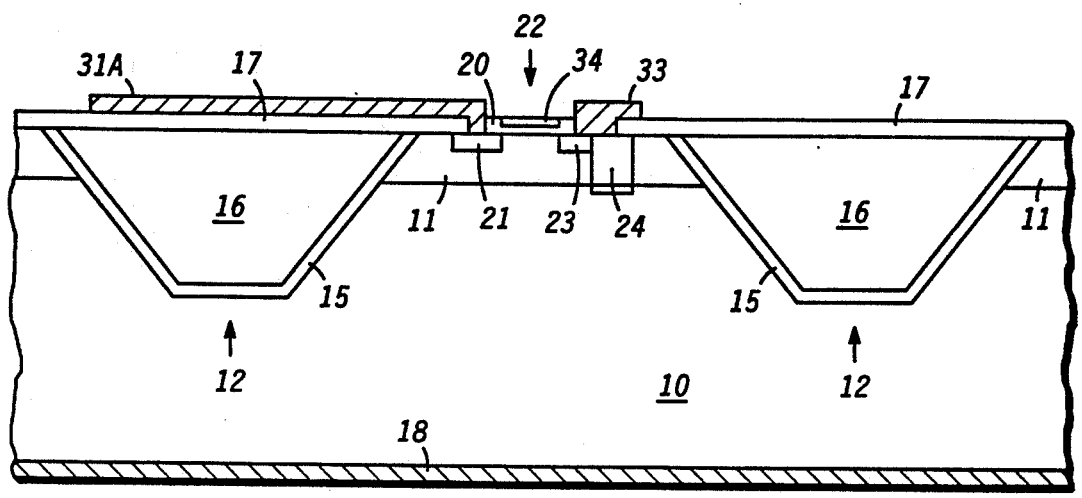
FIG. 4 shows a field effect transistor in the semiconductor device of FIG. 3.

FIG. 4 illustrates a highly enlarged cross-sectional view of a field effect transistor embodiment of the present invention. This embodiment decreases a parasitic drain to substrate capacitance. In the field effect transistor embodiment, a field effect transistor, commonly referred to as a FET, is fabricated in an active area between troughs 12. Although, the FET may be fabricated adjacent to a single trough 12. Further, the FET is fabricated using generally accepted fabrication techniques which are familiar to those skilled in the arts.

The FET comprises a drain region 21, a gate region 22, a source region 23, a bottom contact 18, a first conductive interconnect 31A, a second conductive interconnect 33, and an implant region 24; wherein implant region 24 is commonly referred to as a plug 24. In a preferred FET embodiment, drain region 21 and source region 23 are silicon having an N+ conductivity type, whereas gate region 22 comprises polysilicon 34 and gate oxide 20.

Also in this embodiment, source region 23 electrically contacts plug 24, wherein plug 24 is silicon having a P+ conductivity type and extends into substrate material 10. Plug 24 is shorted with source region 23 by conductive material 33, thus plug 24 provides electrical coupling of source region 23 with substrate 10. What is more, the concentration of impurity material in substrate 10 is such that substrate 10 behaves, electrically, as a conductive plane. Source region 23 electrically contacts bottom contact 18.

Portions of first conductive interconnect 31A are formed above at least one trough 12, wherein in this embodiment portions of conductive interconnect 31A serve as a top surface interconnection. Moreover, first conductive interconnect 31A is coupled to drain region 21, thus a parasitic capacitance between drain region 21 and substrate 10 is formed. First conductive interconnect 31A and substrate 10 serve as the capacitor electrodes of the parasitic capacitor, and first, second, and third dielectric materials, 15, 16, and 17 respectively serve as a dielectric material.

Typically, in a conventional device, the thickness of the dielectric material of the parasitic capacitance formed between drain region 21 and substrate 10 is approximately the thickness of third dielectric material 17. Thus, the present invention provides a means to increase the dielectric thickness of the parasitic capacitance formed between drain interconnect 31A and substrate 10; thereby decreasing the value of this parasitic capacitance, and increasing the frequency performance of a semiconductor device incorporating the present invention.

Figure 5:
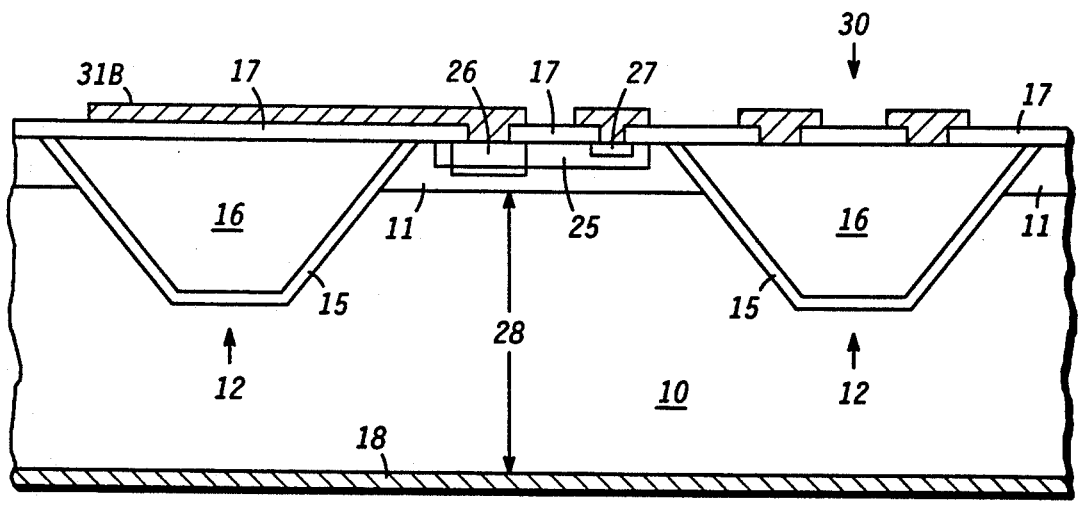
FIG. 5 shows a bipolar junction transistor in the semiconductor device of FIG. 3.

FIG. 5 illustrates a highly enlarged cross-sectional view of a bipolar junction transistor embodiment of the present invention. This embodiment decreases a parasitic collector to base capacitance. In the bipolar junction transistor embodiment, a bipolar junction transistor, commonly referred to as a bipolar transistor, is fabricated in an active area or a region between troughs 12. As in the FET embodiment, the bipolar transistor may be fabricated in an active area adjacent to a single trough 12. Further, the bipolar transistor is fabricated using generally accepted fabrication techniques which are familiar to those skilled in the arts.

In the bipolar transistor embodiment, the semiconductor device is a bipolar transistor having a base region 25, an emitter region 27, and a collector region 28, and a bottom contact 18. Further, collector region 28 is electrically coupled to bottom contact 18. In a preferred bipolar transistor embodiment substrate 10 is single crystal silicon having an N++ conductivity type, epitaxial layer 11 has N− conductivity type, a base contact region 26 has P+ conductivity type, and emitter region 27 has N− conductivity type.

What is more, a portion of conductive interconnect 31B is formed above a portion of trough 12 while a different portion of conductive interconnect 31B is coupled to base contact region 26. Thus, a parasitic capacitance is formed from a portion of substrate 10 and base interconnect 31B. Conductive interconnect 31B and bottom contact 18 serve as capacitor electrodes of the parasitic capacitor, whereas the portion of substrate 10 is highly doped and serves as a portion of the capacitor electrode comprising bottom contact 18. First, second, and third dielectric materials, 15, 16, and 17 respectively, serve as the dielectric material.

Analogous to the FET embodiment, the thickness of the dielectric material of the parasitic capacitance formed between base interconnect 31B and collector 28 of a conventional device typically has been the thickness of third dielectric material 17. Thus, the present invention provides a means to increase the dielectric thickness of the parasitic capacitance formed between base interconnect 31B and bottom contact 18; thereby decreasing the value of this parasitic capacitance, and increasing the frequency performance of a semiconductor device incorporating the present invention.

Further, the embodiment shown in FIG. 5 includes a passive circuit element 30 in at least one trough 12. It should be understood that the dielectric material of the at least one trough 12 in which a passive component is fabricated is polysilicon, and further that an impurity material has been introduced into the polysilicon. In one embodiment passive component 30 is a resistor. In another embodiment, the at least one trough 12 forms a portion of a capacitor.

It should be realized that trough 12 can be configured wherein trough 12 surrounds an active device area, much like a moat. Moreover, it will be understood that the FET and bipolar transistor embodiments presented employ bottom contact devices because this invention is particularly suited to these types of devices. And it should be further understood that the embodiments described in FIG. 4 and FIG.5 are given as examples and are not limitations of the present invention.

By now it should be appreciated that there has been provided an improved semiconductor integrated circuit capable of operating at higher frequencies. As is obvious to those skilled in the arts, the capacitance value of a parasitic capacitor is inversely related to the frequency performance of an integrated circuit device. Further, the capacitance value of a parasitic capacitor is inversely proportional to the dielectric thickness of the capacitor. Hence, the cut-off frequency of the integrated circuit device is also inversely proportional to the capacitance value of the parasitic capacitance. Moreover, increasing the effective dielectric thickness of the parasitic capacitor decreases the capacitance, thereby improving the frequency performance of the semiconductor device. What is more, the present invention can be used to increase a dielectric thickness between any top surface interconnection and an underlying semiconductor substrate to reduce an associated parasitic capacitance.

Further, a cost advantage is realized by this invention because the improved frequency response is obtained while still using silicon as the semiconductor material, rather than the comparatively expensive gallium arsenide.

We claim:

1. A method for making a semiconductor device having an improved frequency response, comprising:
providing a semiconductor substrate, the semiconductor substrate having a top surface and a bottom surface;
providing an epitaxial layer on the top surface of the semiconductor substrate;
forming at least one trough through the epitaxial layer, the at least one through extending into the semiconductor substrate;
lining the at least one through with a first dielectric material, wherein the first dielectric material serves as an insulating layer that masks the at least one through;
filling the at least one through with a second dielectric material, wherein the second dielectric material extends above the epitaxial layer;
planarizing the second dielectric material, wherein a portion of the epitaxial layer is removed;
covering the epitaxial layer and the second dielectric material with a third dielectric material, wherein the first, second, and third dielectric materials collectively serve as a dielectric material of a parasitic capacitor;
fabricating at least one semiconductor device in an active area adjacent to the at least one through, the at least one semiconductor device comprising a first region, a second region, and a third region, wherein the first region includes the bottom surface of the semiconductor substrate;
providing a bottom contact to the first region of the semiconductor substrate, wherein the bottom contact serves as a first electrode of the parasitic cpacitor and a first electrode of the at least one semiconductor device;
providing a conductive interconnect wherein the conductive interconnect is over the the at least one through and extends to the second region of the at least one semiconductor device, the conductive interconnect serving as a second electrode of the parasitic capacitor and a second electrode of the at least one semiconductor device; and
providing a third electrode to the at least one semiconductor device, werein the third electorde contacts the third region of the at least one semiconductor device.

2. The method for making a semiconductor device of claim 1 further including forming the at least one through with an anisotropic etch.

3. The method for making a semiconductor device of claim 1 further including depositing polysilicon as the second dielectric material wherein the polysilicon has a resistivity greater than 100 ohm-centimeter.

4. The method for making a semiconductor device of claim 1 further including growing the first dielectric material at temperatures sufficiently low to minimize autodoping of impurity materials from the semiconductor substrate material into the epitaxial layer.

5. The method for making a semiconductor device of claim 1 further including forming a passive circuit element in the second dielectric material.

6. A method for increasing a thickness of dielectric material of a parasitic capacitor between at least one conductive interconnect leading to a semiconductor device and an underlying semiconductor substrate, which comprises:
providing the semiconductor substrate, the semiconductor substrate having a top surface and a bottom surface;
growing an epitaxial layer on the top surface of the semiconductor substate, the epitaxial layer having a top surface;
forming at least one trough in the semiconductor substrate, wherein the at least one through extends from the top surface of the epitaxial layer into the semiconductor substrate;
masking the top surface of the epitaxial layer and the at least one trough with an insulating layer, wherein the insulating layer serves as a layer which leaves the at least one trough unfilled;
depositing a second dielectric material over the insulating layer, wherein the second dielectric material fills the at least one through and extends above the insulating layer which masks the top surface of the epitaxial layer;
removing a portion of the second dielectric material wherein the removing step comprises a two step operation of removing and polishing the second dielectric material;

growing a field oxide over a top surface of the second dielectric material;

fabricating at least one semiconductor device in an area adjacent to the at least one trough, wherein the at least one semiconductor device comprises a first region bounded by the bottom surface of the semiconductor substrate, a second region, and a third region;

providing a bottom contact to the bottom surface of the semiconductor substrate;

forming the parasitic capacitor by providing a conductive interconnect over the at least one trough, the conductive interconnect extending to the second region, the parasitic capacitor comprising the conductive interconnect, the at least one trough, and the bottom contact; and providing an electrode to the third region of the at least one semiconductor device.

7. The method for increasing a thickness of dielectric material of a parasitic capacitor of claim 6 further including forming the at least one trough by a wet etch, the at least one trough having a width of approximately 4 millimeters at the top surface of the epitaxial layer and a depth of approximately 20 micrometers.

8. The method for increasing a thickness of dielectric material of a parasitic capacitor of claim 6 further including depositing intrinsic polysilicon as the second dielectric material.

9. The method for increasing a thickness of dielectric material of a parasitic capacitor of claim 6 wherein the removing step further includes removing a portion of the epitaxial layer.

* * * * *

UNITED STATES PATENT AND TRADEMARK OFFICE
CERTIFICATE OF CORRECTION

PATENT NO. : 5,254,491

DATED : October 19, 1993

INVENTOR(S) : Bernard W. Boland et al.

It is certified that error appears in the above-identified patent and that said Letters Patent is hereby corrected as shown below:

```
Column 5, line 55, change "through" to --trough--.
Column 5, line 57, change "through" to --trough--.
Column 5, line 60, change "through" to --trough--.
Column 5, line 61, change "through" to --trough--.
Column 6, line 4,  change "through" to --trough--.
Column 6, line 12, change "cpacitor" to --capacitor--.
Column 6, line 16, change "through" to --trough--.
Column 6, line 22, change "werein" to --wherein--.
Column 6, line 22, change "electorde" to --electrode--.
Column 6, line 27, change "through" to --trough--.
Column 6, line 62, change "through" to --trough--.
```

Signed and Sealed this

Fifth Day of April, 1994

*Attest:*

BRUCE LEHMAN

*Attesting Officer*  *Commissioner of Patents and Trademarks*